United States Patent
Teoh et al.

(10) Patent No.: US 7,254,692 B1
(45) Date of Patent: Aug. 7, 2007

(54) TESTING FOR OPERATING LIFE OF A MEMORY DEVICE WITH ADDRESS CYCLING USING A GRAY CODE SEQUENCE

(75) Inventors: Wan Yen Teoh, Penang (MY); Che Seong Law, Penang (MY)

(73) Assignee: Advanced Micro Devices, Inc., Sunnyvale, CA (US)

( * ) Notice: Subject to any disclaimer, the term of this patent is extended or adjusted under 35 U.S.C. 154(b) by 365 days.

(21) Appl. No.: 10/791,417

(22) Filed: Mar. 2, 2004

(51) Int. Cl.
*G06F 12/00* (2006.01)
(52) U.S. Cl. .................. 711/218; 711/103; 714/702; 714/718; 365/230.03; 365/230.06
(58) Field of Classification Search .............. 711/103, 711/218; 714/702, 718; 365/230.03, 230.06
See application file for complete search history.

(56) References Cited

U.S. PATENT DOCUMENTS

| | | | | |
|---|---|---|---|---|
| 5,276,647 A | * | 1/1994 | Matsui et al. ................ 365/201 |
| 5,375,091 A | * | 12/1994 | Berry et al. ................ 365/201 |
| 5,446,741 A | * | 8/1995 | Boldt et al. ................. 714/718 |
| 5,450,363 A | * | 9/1995 | Christopherson et al. ...... 341/98 |
| 5,570,317 A | * | 10/1996 | Rosen et al. ................ 365/200 |
| 5,630,086 A | * | 5/1997 | Marietta et al. ................ 711/5 |
| H1741 H | * | 7/1998 | Cruts ......................... 714/720 |
| 5,872,449 A | * | 2/1999 | Gouravaram et al. ..... 324/158.1 |
| 5,883,844 A | * | 3/1999 | So .............................. 365/201 |
| 5,987,574 A | * | 11/1999 | Paluch ........................ 711/158 |
| 6,308,249 B1 | * | 10/2001 | Okazawa .................... 711/218 |
| 6,549,479 B2 | * | 4/2003 | Blodgett ...................... 365/222 |
| 6,894,937 B2 | * | 5/2005 | Garni et al. ................. 365/201 |
| 6,965,526 B2 | * | 11/2005 | Cavaleri et al. ....... 365/185.29 |
| 7,076,710 B2 | * | 7/2006 | Knips et al. ................. 714/734 |

OTHER PUBLICATIONS

Lee et al. "Mobile Ion-Induced Data Retention Failure in NOR Flash Memory Cells", Jun. 2001, IEE Transactions on Device and Materials Reliability, vol. 1, No. 2, pp. 128-132.*
Brand et al., "Novel Read Disturb Failure Mechanism Induced by FLASH Cycling", 1993, Reliability Physics Symposium, 31st Annual Proceedings, IEEE International, pp. 127-132.*
Fastow et al., "Bake Induced Charge Gain in NOR Flash Cells", Apr. 2000, IEEE Electronic Device Letters, vol. 21, No. 4, pp. 184-186.*
Hakenes et al., "A Segmented Gray Code for Low-Power Microcontroller Address Buses", 1999, Proceedings of the 25th EUROMICRO Conference, IEEE, pp. 1-4.*

* cited by examiner

*Primary Examiner*—Sanjiv Shah
*Assistant Examiner*—Arpan Savla
(74) *Attorney, Agent, or Firm*—Monica H. Choi

(57) ABSTRACT

In a method and system for cycling through addresses of a memory device, a respective bit pattern comprised of a predetermined number of bits is generated for each address. The respective bit pattern for each of the addresses is cycled through with a transition of less than the predetermined number of bits for sequencing to each subsequent address. For example, the respective bit pattern for each of the addresses is cycled through in a gray code sequence. By limiting the number of transitions in the address bits, charge gain failure of a flash memory device is minimized and even may be eliminated.

20 Claims, 9 Drawing Sheets

| | Experimental Condition | Row Location for Charge Gain Failure | Quantity Failed |
|---|---|---|---|
| 322 → | Ascending Binary | Row 0, Sector 0 | 1/90 Units (1 bit failed) |
| 324 → | Descending Binary | Row 511, Sector 31 | 2/90 Units (1 bit failed) |
| 326 → | Descending Binary with A15 Grounded. | Row 495, Sector 31 | 4/90 Units (1 bit failed) |
| 328 → | Descending Binary with A14 Grounded. | Row 503, Sector 31 | 2/90 Units (1 bit failed) |
| 330 → | Gray Code | No Failure | No Failure |
*FIG. 12*
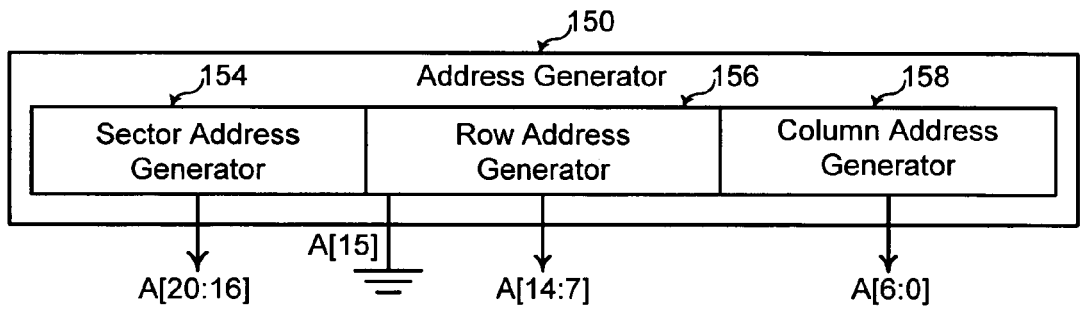
*FIG. 13*
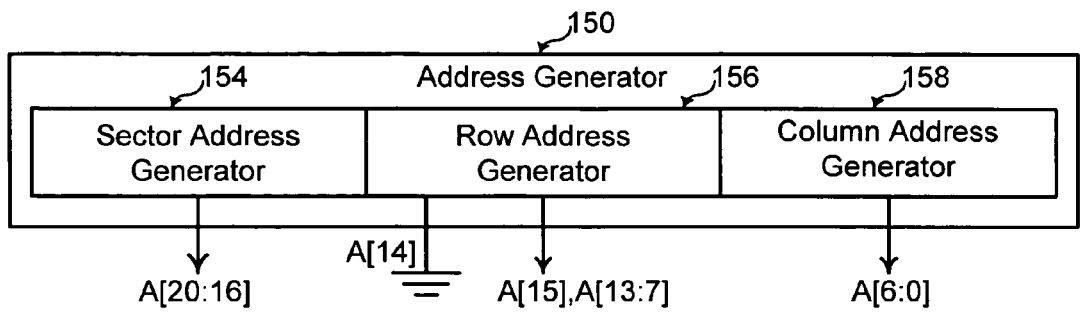
*FIG. 14*

TESTING FOR OPERATING LIFE OF A MEMORY DEVICE WITH ADDRESS CYCLING USING A GRAY CODE SEQUENCE

TECHNICAL FIELD

The present invention relates generally to testing of memory devices, and more particularly, to cycling through addresses of a flash memory device with minimized charge gain failure during testing of the flash memory device.

BACKGROUND OF THE INVENTION

Referring to FIG. 1, a flash memory cell 100 of a flash memory device includes a tunnel dielectric structure 102 typically comprised of silicon dioxide ($SiO_2$) or nitrided oxide as known to one of ordinary skill in the art of integrated circuit fabrication. The tunnel dielectric structure 102 is disposed on a semiconductor substrate or a p-well 103. In addition, a floating gate structure 104, comprised of a conductive material such as polysilicon for example, is disposed over the tunnel dielectric structure 102. A dielectric structure 106, typically comprised of silicon dioxide ($SiO_2$), is disposed over the floating gate structure 104. A control gate structure 108, comprised of a conductive material, is disposed over the dielectric structure 106.

A drain bit line junction 110 that is doped with a junction dopant, such as arsenic (As) or phosphorous (P) for example, is formed within an active device area 112 of the semiconductor substrate or p-well 103 toward a left sidewall of the floating gate structure 104 in FIG. 1. A source bit line junction 114 that is doped with the junction dopant is formed within the active device area 112 of the semiconductor substrate or p-well 103 toward a right sidewall of the floating gate structure 104 of FIG. 1.

During the program or erase operations of the flash memory cell 100 of FIG. 1, charge carriers are injected into or tunneled out of the floating gate structure 104. Such variation of the amount of charge carriers within the floating gate structure 104 alters the threshold voltage of the flash memory cell 100, as known to one of ordinary skill in the art of flash memory technology. For example, when electrons are the charge carriers that are injected into the floating gate structure 104, the threshold voltage increases. Alternatively, when electrons are the charge carriers that are tunneled out of the floating gate structure 104, the threshold voltage decreases. These two conditions are used as the two states for storing digital information within the flash memory cell 100, as known to one of ordinary skill in the art of flash memory technology.

For example, during programming of the flash memory cell 100 that is an N-channel flash memory cell, electrons are injected into the floating gate structure 104 to increase the threshold voltage of the flash memory cell 100. Alternatively, during erasing of the N-channel flash memory cell 100, electrons are pulled out of the floating gate structure 104 to the substrate or p-well 103 to decrease the threshold voltage of the flash memory cell 100.

FIG. 2 illustrates a circuit diagram representation of the flash memory cell 100 of FIG. 1 including a control gate terminal 120 coupled to the control gate structure 108, a drain terminal 122 coupled to the drain bit line junction 110, a source terminal 124 coupled to the source bit line junction 114, and a substrate or p-well terminal 126 coupled to the substrate or p-well 103. FIG. 3 illustrates an electrically erasable and programmable memory device 130 comprised of an array of flash memory cells, as known to one of ordinary skill in the art of flash memory technology. Referring to FIG. 3, the array of flash memory cells 130 includes rows and columns of flash memory cells with each flash memory cell having similar structure to the flash memory cell 100 of FIGS. 1 and 2.

The array of flash memory cells 130 of FIG. 3 is illustrated with two columns and two rows of flash memory cells for simplicity and clarity of illustration. However, a typical array of flash memory cells comprising an electrically erasable and programmable memory device has more numerous rows and columns of flash memory cells.

Further referring to FIG. 3, in the array of flash memory cells 130 comprising an electrically erasable and programmable memory device, the control gate terminals of all flash memory cells in a row of the array are coupled together to form a respective word line for that row. In FIG. 3, the control gate terminals of all flash memory cells in the first row are coupled together to form a first word line 132, and the control gate terminals of all flash memory cells in the second row are coupled together to form a second word line 134.

In addition, the drain terminals of all flash memory cells in a column are coupled together to form a respective bit line for that column. In FIG. 3, the drain terminals of all flash memory cells in the first column are coupled together to form a first bit line 136, and the drain terminals of all flash memory cells in the second column are coupled together to form a second bit line 138. Further referring to FIG. 3, the source terminal of all flash memory cells of the array 130 are coupled together to a source voltage $V_{SS}$, and the substrate or p-well terminal of all flash memory cells of the array 130 are coupled together to a substrate voltage $V_{SUB}$.

FIG. 4 illustrates an example address generator 150 for cycling through addresses of an array of flash memory cells 152 of FIG. 5. The array of flash memory cells 152 for example is a sixteen Megabit memory device that is horizontally partitioned into thirty-two sectors, S0, S1, and so on to S31. Each of such sectors has five hundred and twelve rows of flash memory cells, and each row has a corresponding word line R0, R1, and so on to R511, that is each coupled to the control gate of all flash memory cells in a row.

In addition, the array of flash cells 152 is vertically partitioned into eight I/O areas I/O(0), I/O(1), and so on to I/O(7). Each of such I/O areas has one hundred and twenty eight columns of flash memory cells, and each column has a corresponding bit line C0, C1, and so on to C127, that is each coupled to the drain bit line junction of all flash memory cells in a column. Each of the eight I/O areas is coupled to a corresponding I/O of the flash memory device having the array of flash memory cells 152.

The address generator 150 generates twenty-one bits A[20:0] for specifying an address of eight flash memory cells to be accessed via the eight I/O's of the flash memory device. The address generator 150 includes a sector address generator that generates a 5-bit sector address A[20,16] for specifying one of the thirty-two sectors S0, S1, and so on to S31 to be selected. The address generator 150 also includes a row address generator 156 that generates a 9-bit row address A[15:7] for specifying one of the five hundred and twelve rows within the selected sector. The address generator 150 further includes a column address generator 158 that generates a 7-bit column address A[6:0] for specifying one of the hundred and twenty eight columns within each of the eight I/O areas.

During manufacture of the flash memory device comprised of the array of flash memory cells 152, such a flash memory device is tested for proper functionality by cycling through each of the addresses of the flash memory device. During such testing, the address generator 150 cycles through each of the addresses of the flash memory device. In addition, testing voltages are applied on flash memory cells comprising an address as specified by the address generator 150. Typically, the address generator increments by one-bit in a binary sequence through each of the addresses of the flash memory device.

Ideally, a flash memory device is tested for determining the operability of the flash memory device and of the array of flash memory cells 152 in particular. Any deleterious effect on the results of such testing from faulty characteristics of the test system such as from electrical characteristics of the address generator 150 for example is undesirable. If a flash memory cell of the array 152 fails from such electrical characteristics of the address generator 150, it is unclear whether the flash memory cell failed from faulty characteristics of the flash memory cell itself or from faulty characteristics of the test system.

SUMMARY OF THE INVENTION

Accordingly, in a general aspect of the present invention, failure of a flash memory cell after a last row of an array of flash memory cells is accessed is determined to be from charge gain failure when a large number of bit transitions occurs from an address generator using binary sequence. Such charge gain failure is minimized and even may be eliminated by preventing such a faulty characteristic of the address generator.

In a method and system for cycling through addresses of a memory device, a respective bit pattern comprised of a predetermined number of bits is generated for each address. The respective bit pattern for each of the addresses is cycled through with a transition of less than the predetermined number of bits for sequencing to each subsequent address.

In an example embodiment of the present invention, the respective bit pattern for each of the addresses is cycled through in a gray code sequence. With the gray code sequence, when the memory device is a flash memory device, charge gain failure is eliminated for the flash memory device, such as during a test for HTOL (high temperature operating life) of the memory device.

In a broader embodiment of the present invention, the respective bit pattern for each of the addresses is cycled through with a transition of a fixed number of bits for sequencing to each subsequent address.

By limiting the number of transitions in the address bits during sequencing to each subsequent address during cycling through the addresses of the memory device, charge gain failure is minimized and even may be eliminated. Such elimination of charge gain failure is especially advantageous during cycling through the addresses of a flash memory device during HTOL testing. Because charge gain failure results from undesired characteristics of the system for testing for HTOL, elimination of charge gain failure does not cloud determination of the operability of the flash memory device itself.

The present invention is described for eliminating charge gain failure during HTOL testing. However, the present invention may also be advantageously applied for eliminating charge gain failure during cycling through the addresses of a flash memory device for any other applications or scenarios other than for the example of HTOL testing.

These and other features and advantages of the present invention will be better understood by considering the following detailed description of the invention which is presented with the attached drawings.

BRIEF DESCRIPTION OF THE DRAWINGS

FIG. 12 shows a table of experimental results illustrating charge gain failure from a large number of bit transitions in the address bits cycling through in binary sequence;

FIG. 13 shows the address generator of FIG. 4 with a first one of the address bits A[15] grounded; and FIG. 14 shows the address generator of FIG. 4 with a second one of the address bits A[14] grounded.

The figures referred to herein are drawn for clarity of illustration and are not necessarily drawn to scale. Elements having the same reference number in FIGS. 1, 2, 3, 4, 5, 6, 7, 8, 9, 10, 11, 12, 13, and 14 refer to elements having similar structure and function.

DETAILED DESCRIPTION

Figure 6:
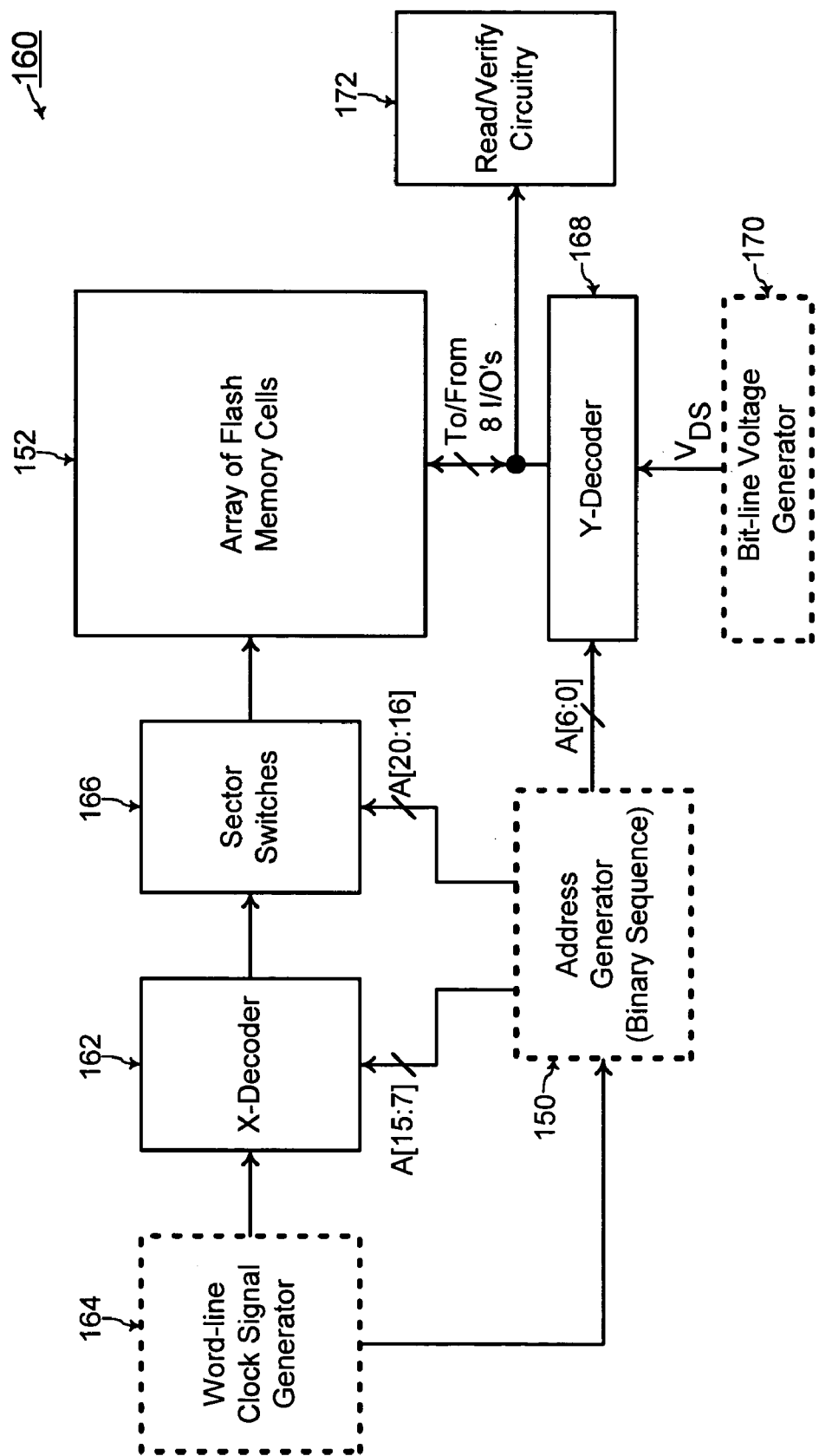
FIG. 6 illustrates a block diagram with components of the flash memory device having the array of flash memory cells of FIG. 5 and with additional components for HTOL (high temperature operating life) stressing.

FIG. 6 illustrates components of a flash memory device 160 including the array of flash memory cells 152. Components considered part of the flash memory device 160 are outlined in solid lines in FIG. 6, and components not considered part of the flash memory device 160 are outlined in dashed lines in FIG. 6. FIG. 6 includes components (outlined in dashed lines) that are not part of the flash memory device 160 and are for performing HTOL (high temperature operating life) stressing for the flash memory device 160.

The flash memory device 160 includes an X-decoder 162 that inputs and decodes the row address A[15:7] to couple a clock signal from a word line clock signal generator 164 to the word line for a selected one of the five hundred twelve rows as specified by the row address A[15:7]. For example, the clock signal from the clock signal generator 164 is a 1 MHz (mega-hertz) typical clock signal wave-form. In addition, the flash memory device 160 includes sector switches 166 that input and decode the sector address A[20:16] to couple the clock signal to the word line of the selected row from the X-decoder for one of the thirty-two selected sectors as specified by the sector address A[20:16]

Furthermore, the flash memory device 160 includes a Y-decoder 168 that inputs and decodes the column address A[6:0] to couple a bit line voltage $V_{DS}$ from a bit line voltage generator 170 to a bit line for a selected one of the hundred and twenty eight columns as specified by the column address A[6:0] for each of the eight I/O areas. Additionally, the Y-decoder 168 is coupled to read/verify circuitry 172 that performs a read of data from the selected one of the hundred and twenty eight columns as specified by the column address A[6:0] for each of the eight I/O areas.

The clock signal generator 164 is coupled to the address generator 150 for driving the address generator 150 with the clock signal generated from the clock signal generator 164. Such components 150, 152, 162, 164, 166, 168, 170, and 172 of FIG. 6 are in general individually known to one of ordinary skill in the art.

Figure 7:
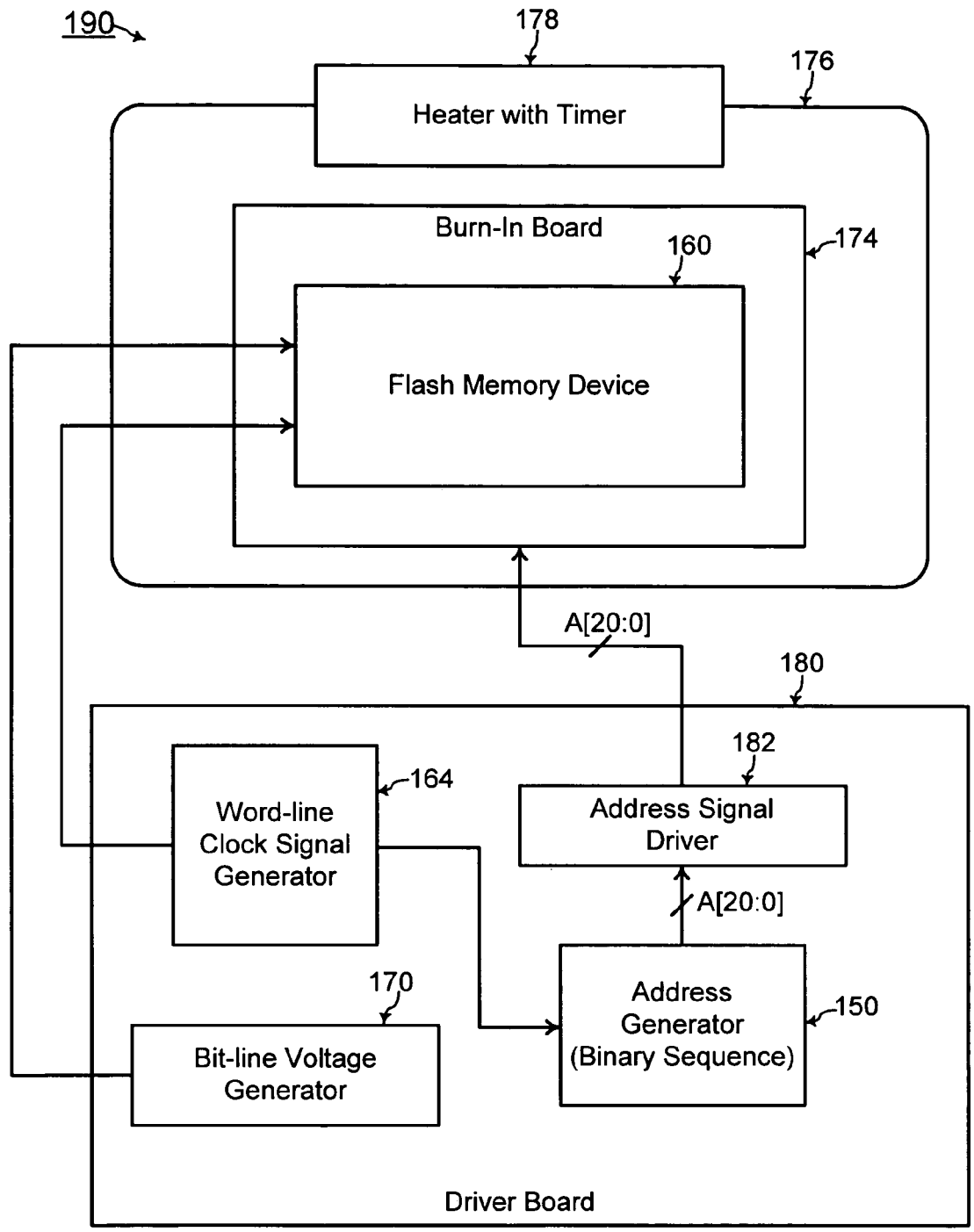
FIG. 7 illustrates a block diagram of a system for performing HTOL stressing for the flash memory device of FIG. 6.

Referring to FIG. 7, in a HTOL (high temperature operating life) test system 190 for performing HTOL stressing, the flash memory device 160 is mounted to a burn-in board 174 that is placed within a heating chamber 176. A heater 178 heats the heating chamber 176 such that the temperature within the heating chamber 176 is maintained at a predetermined temperature such as 150° Celsius for example.

The address generator 150, the word line clock signal generator 164, and the bit line voltage generator 170 are mounted to a driver board 180 disposed outside of the heating chamber 176. An address signal driver 182 couples the address bits A[20:0] from the address generator 150 to the burn-in board 174. The burn-in board includes leads for coupling the clock signal from the clock signal generator 164, the bit line voltage from the bit line voltage generator 170, and the address bits A[20:0] from the address generator 150 to the flash memory device 160 as illustrated in FIG. 6.

The HTOL test indicates the operating life-time of the flash memory device 160. For accelerating such testing, the flash memory device 160 is placed into the heating chamber 176 to be heated to the predetermined temperature of 150° Celsius for example for a predetermined stress time period such as 168 hours for example. In addition, during such stress time period, each address as specified by a respective bit pattern of the twenty-one bits A[20:0] is cycled through one-bit at a time in a binary sequence in FIG. 6.

For any particular address, the word line of the row indicated by such an address has applied thereon the clock signal from the clock signal generator 164. The clock signal is a typical square wave clock signal with a frequency of 1 MHz for example and with an amplitude similar to the voltage $V_{DS}$ from the bit line voltage generator 190. Furthermore, the bit line of the column for each of the eight I/O's as specified by such an address has applied thereon the bit line voltage $V_{DS}$ that is about 6.5 Volts for example from the bit line voltage generator 190. The body and source terminal of each of the flash memory cells of the array 152 is coupled to a ground node.

During the stress time period of 168 hours for the HTOL stressing, the address generator 150 increments or decrements by one bit for the address bits A[20:0] in a binary sequence every cycle of the clock signal from the clock signal generator 164. The address generator 150 may increment or decrement by one bit every clock cycle in either an ascending or a descending order. In the ascending order, the address bits A[20:0] start with all "0's" (i.e., "000 . . . 000") and then increment by one bit until all "1's" (i.e., "111 . . . 111") are reached for A[20:0]. Alternatively, in the descending order, the address bits A[20:0] start with all "1's" (i.e., "111 . . . 111") and then decrement by one bit until all "0's" (i.e., "000 . . . 000") are reached for A[20:0]. Such a binary sequence with incrementing or decrementing by one-bit in the ascending or descending order is known to one of ordinary skill in the art.

In any case, all "1's" for the sector address bits A[20:16] specifies the last sector S311 and all "0's" for the sector address bits A[20:16] specifies the first sector S0. Similarly, all "1's" for the row address bits A[15:7] specifies the last row R511, and all "0's" for the row address bits A[15:7] specifies the first row R0. In addition, all "1's" for the column address bits A[6:0] specifies the last column C127, and all "0's" for the column address bits A[6:0] specifies the first column C0, for each of the eight I/O's.

After the stress time period of 168 hours for the HTOL stressing, the operation of the flash memory device 160 is determined. For example, before the stress time period of 168 hours, the array of flash memory cells 152 may have been programmed and erased in a checker-board pattern. With such a checker-board pattern, the flash memory cells in a row are programmed and erased in an alternating pattern, and the flash memory cells in a column are programmed and erased in an alternating pattern.

After being programmed and erased in such a checker-board pattern, the flash memory device 160 is placed within the heating chamber 176 on the burn-in board 174 for the stress time period of 168 hours. During such a stress time period of 168 hours, the clock signal from the clock signal generator 164 and the bit line voltage $V_{DS}$ from the voltage generator 170 are applied on the eight flash memory cells of the array 152 as specified by the address bits A[20:0] from the address generator 150. In addition, the address bits A[20:0] are incremented or decremented by one-bit every cycle of the clock signal from the clock signal generator 164 during the stress time period of 168 hours. After such a stress time period of 168 hours, the flash memory device 160 is tested to determine whether the array of flash memory cells 152 still retains the checker-board pattern of being programmed and erased.

Figure 8:
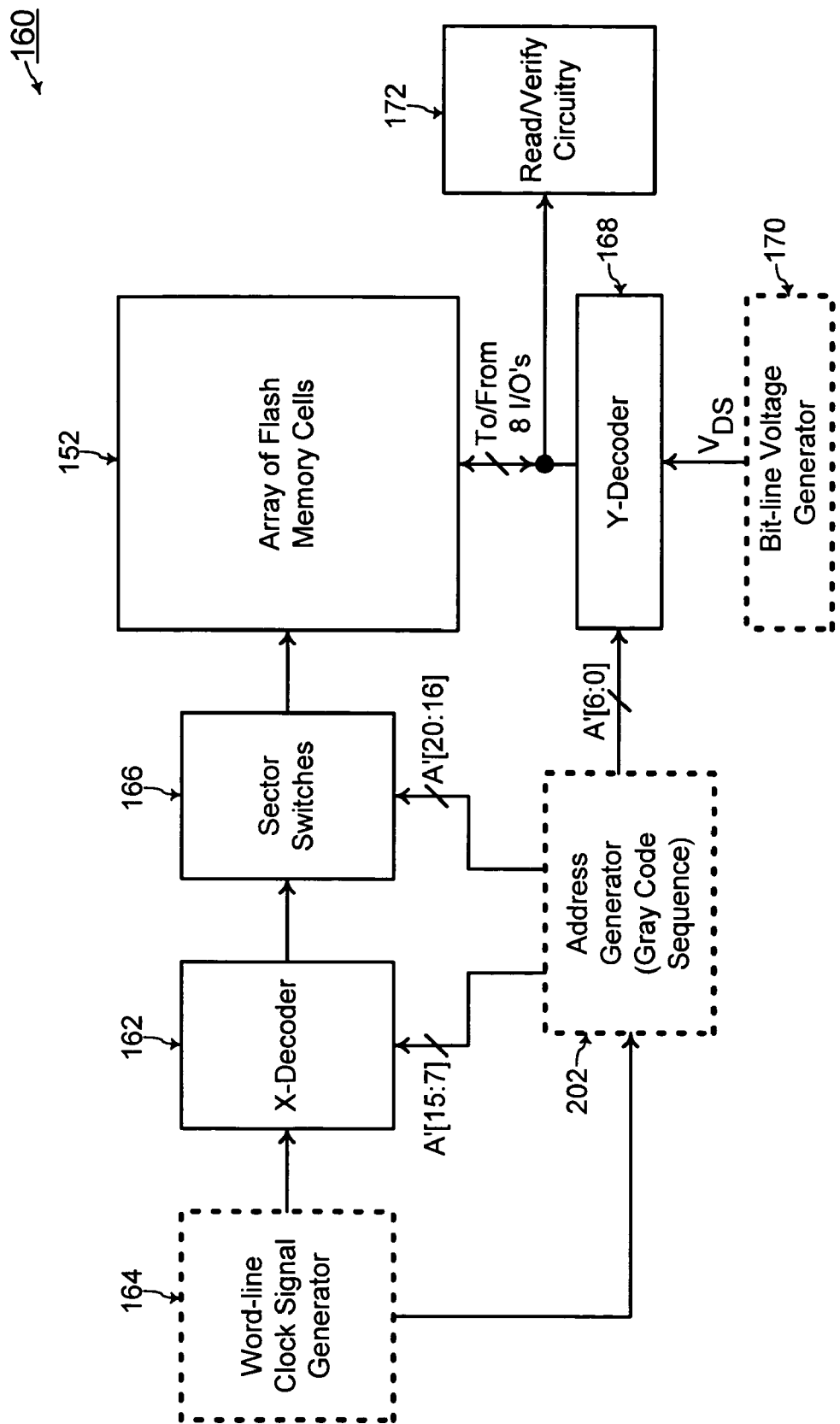
FIG. 8 illustrates a block diagram with components of a flash memory device and with additional components for HTOL (high temperature operating life) stressing using an address generator that cycles through addresses of the flash memory device in gray code sequence, according to an embodiment of the present invention.

FIG. 8 is similar to FIG. 6 showing the components of the flash memory device 160 outlined in solids lines. Elements having the same reference number in FIGS. 6 and 8 refer to elements having similar structure and function. However, in FIG. 8, a gray code address generator 202 cycles through addresses of the array of flash memory cells 152 in gray code sequence (instead of in binary sequence of the address generator 150 in FIG. 6). The gray code address generator 202 generates alternative sector address bits A'[20:16] to the sector switches 166, alternative row address bits A'[15:7] to the X-decoder 162, and alternative column address bits A'[6:0] to the Y-decoder 168, with the address bits A'[20:0] generated in gray code sequence.

Figure 9:
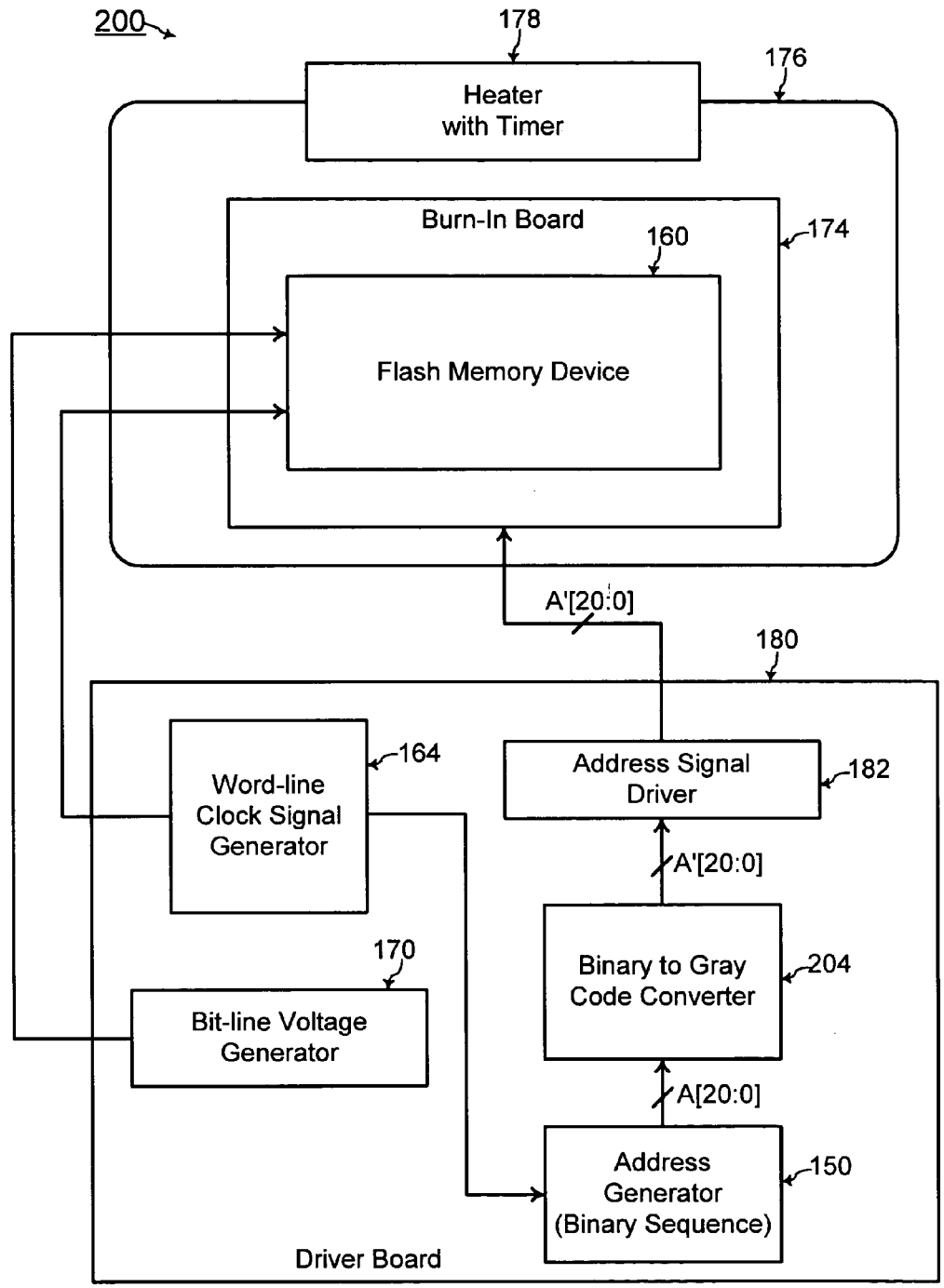
FIG. 9 illustrates a block diagram of a system for performing HTOL stressing by cycling through addresses of the flash memory device in gray code sequence, according to an embodiment of the present invention.

FIG. 9 shows an alternative HTOL (high temperature operating life) test system 200 having the gray code address generator 202 that is comprised of a binary to gray code converter 204 coupled between the binary address generator 150 and the address signal driver 182. Elements having the same reference number in FIGS. 7 and 9 refer to elements having similar structure and function. However, in FIG. 9, the binary to gray code converter 204 converts the address bits A[20:0] generated from the binary address generator 150 in binary sequence to alternative address bits A'[20:0] in gray code sequence.

Figures 10, 11:
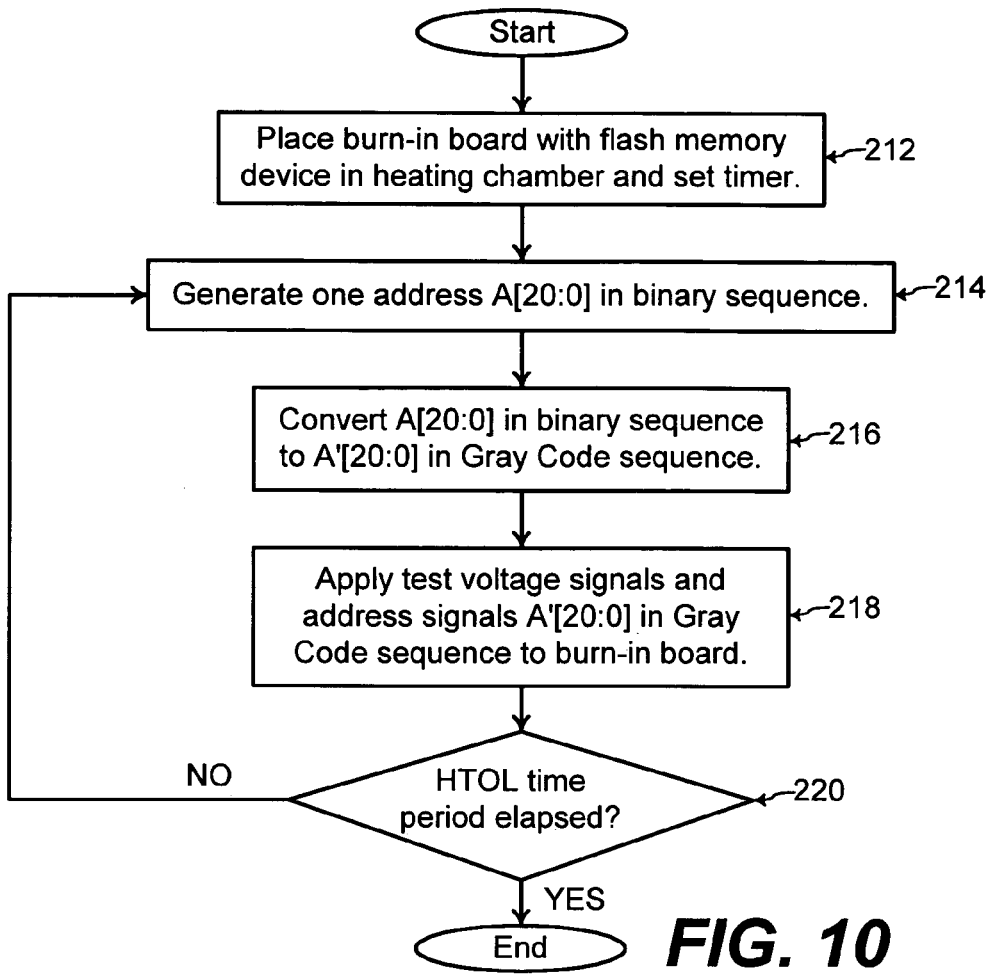
FIG. 10 shows a flow-chart of steps for HTOL (high temperature operating life) stressing during operation of the system of FIG. 9, according to an embodiment of the present invention.
FIG. 11 shows a table of sequencing through a three-bit address in binary sequence versus gray code sequence for an example illustration.

FIG. 10 illustrates a flowchart of steps performed by the HTOL test system 200 for HTOL (high temperature operating life) stressing. The burn-in board 174 with the flash memory device 160 under test is placed into the heating chamber 176 that is maintained at the predetermined temperature such as 150° Celsius for example (step 212 of FIG. 10). In addition, the timer 178 is set for the predetermined stress time period such as 168 hours for example after the burn-in board 174 with the flash memory device 160 is placed into the heating chamber 176 (step 212 of FIG. 10).

The binary address generator 150 generates one address A[20:0] in binary sequence (step 214 of FIG. 10). The binary to gray code converter 204 converts the address A[20:0] generated in binary sequence to a corresponding gray code address A'[20:0] generated in gray code sequence. FIG. 11 illustrates the differences between bits generated in binary sequence and bits generated in gray code sequence. FIG. 11 shows a table with a first column 302 having a binary sequence starting from "0 0 0" for an example three-bit binary address A[2:0] and with a third column 304 having a gray code sequence starting from "0 0 0" for an alternative gray code address A'[2:0]. The first column 302 and the fourth column 308 show incrementing by one-bit for each address of the three bits for one cycle of addresses from "0 0 0" back to "0 0 0".

A second column 306 in FIG. 11 indicates the number of bit transitions between any two subsequent bit patterns in the binary sequence of the first column 302. Similarly, a fourth column 308 indicates the number of bit transitions between any two subsequent bit patterns in the gray code sequence of the third column 304.

Referring to FIG. 11, the number of bit transitions for the binary sequence varies from one to three. All three bits make transitions in the binary sequence when the address increments from "0 1 1" to the subsequent address of "1 0 0" or from "1 1 1" to the subsequent address of "0 0 0". Two bits make transitions in the binary sequence when the address increments from "0 0 1" to the subsequent address of "0 1 0" or from "1 0 1" to the subsequent address of "1 1 0". In contrast, just one bit transition is consistently made in incrementing from any address to the subsequent address in the gray code sequence.

FIG. 11 illustrates an example for the three address bits A[2:0]. However, such a similar table may be generated for any number of address bits such as the twenty-one address bits A[20:0]. A general definition of gray code sequence for N-bits is incrementing or decrementing through the $2^N$ possible bit patterns for the N-bits with just one bit transition between any two subsequent bit patterns in the gray code sequence. Such gray code sequence is in general individually known to one of ordinary skill in the art.

Referring to FIGS. 9 and 10, after the binary address generator 150 generates a binary bit pattern A[20:0] in binary sequence, the binary to gray code converter 204 converts the binary bit pattern A[20:0] to a corresponding gray code bit pattern A'[20:0] in gray code sequence (step 216 in FIG. 10). The gray code bit pattern A'[20:0] is applied to the burn-in board 174 that couples such an address A'[20:0] to the flash memory device 160 (step 218 of FIG. 10). The binary to gray code converter 204 may be implemented for example by programming a PLD (programmable logic device) to convert the binary bit pattern A[20:0] generated in binary sequence to the gray code bit pattern A'[20:0] generated in gray code sequence.

Figure 1:
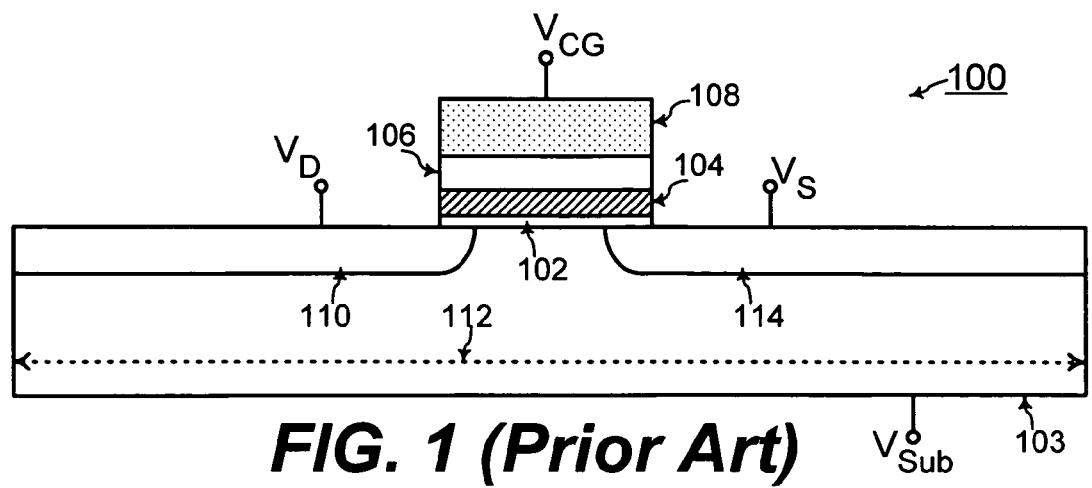
FIG. 1 shows a cross-sectional view of a flash memory cell, according to the prior art.
Figure 2:
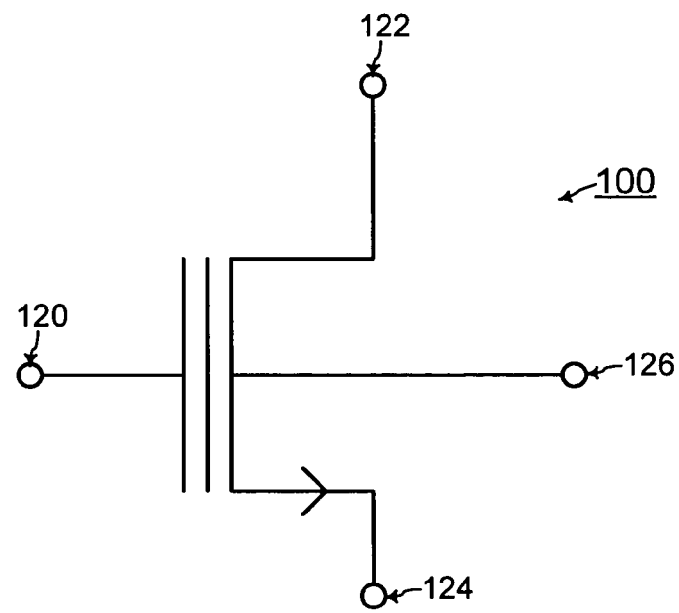
FIG. 2 shows a circuit diagram representation of the flash memory cell of FIG. 1, according to the prior art.
Figure 3:
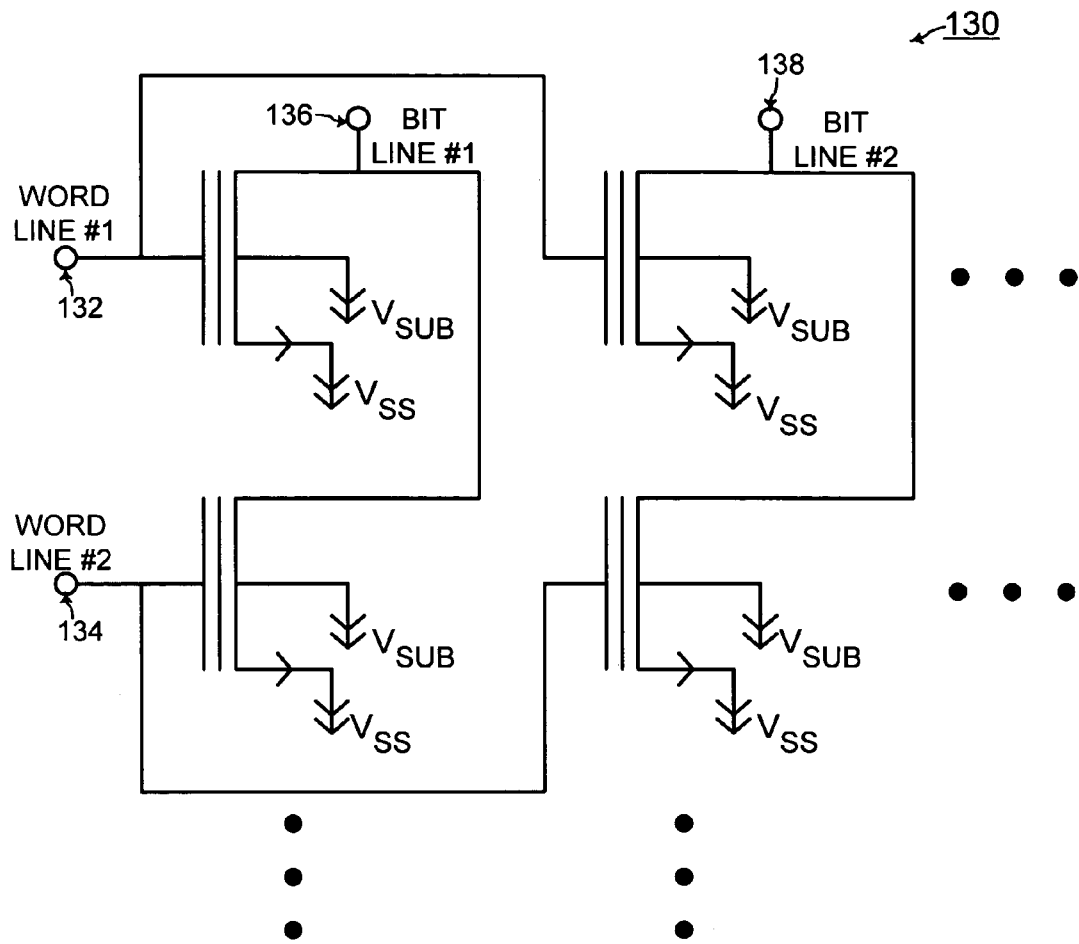
FIG. 3 shows an array of flash memory cells comprising a flash memory device, according to the prior art.
Figure 4:
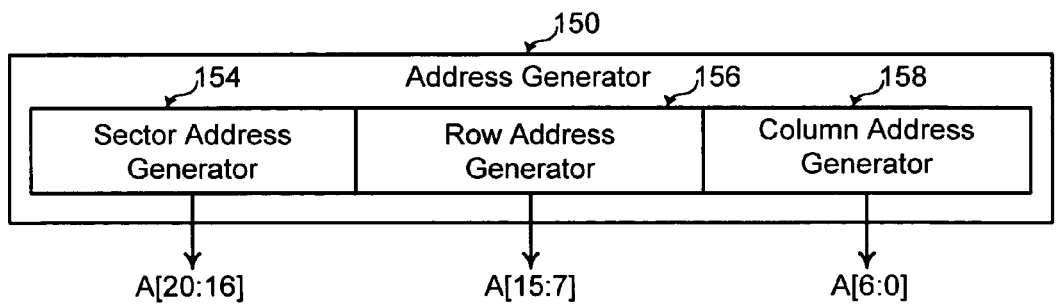
FIG. 4 shows an example address generator for generating address bits A[20:0] in binary sequence for a 16 Megabit flash memory device, according to the prior art.
Figure 5:
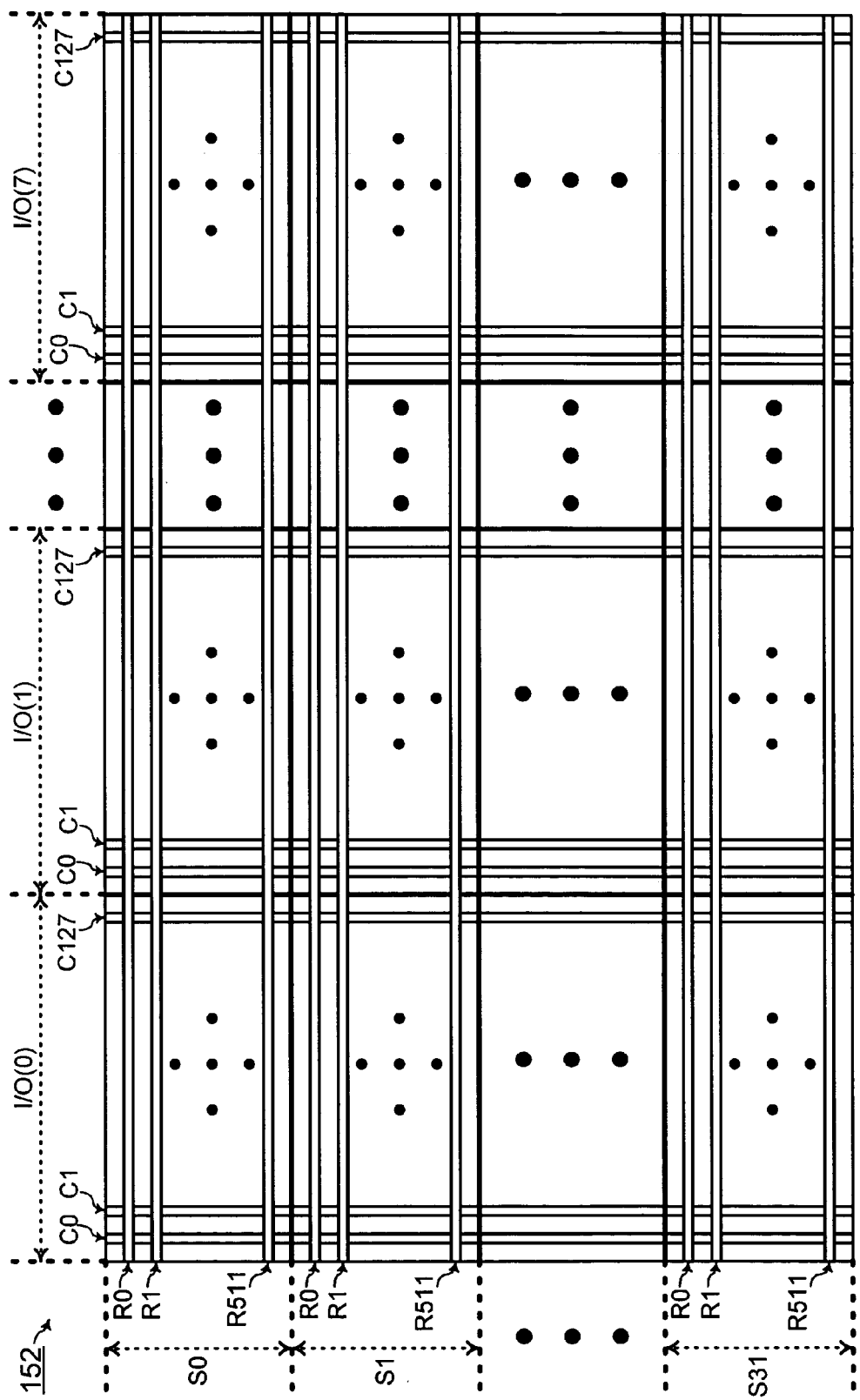
FIG. 5 illustrates an example lay-out of word lines and bit lines of an example 16 Megabit array of flash memory cells accessed with the address generator of FIG. 4, according to the prior art.

Referring to FIGS. 8 and 9, the first five bits A'[20:16] of the gray code bit pattern A' [20:0] are decoded by the sector switches 166, and the next nine bits A'[15:7] of the gray code bit pattern A'[20:0] are decoded by the X-decoder 162. With such decoding, the clock signal generated by the clock signal generator 164 is applied on the word line of the row specified by A'[15:7] of the sector specified by A'[20:16] (step 218 of FIG. 10). In addition, the last seven bits A'[6:0] of the gray code bit pattern A'[20:0] are decoded by the Y-decoder 168 such that the bit line voltage $V_{DS}$ generated by the bit line voltage generator 170 is applied on the bit line of the column specified by A'[6:0] for each of the eight I/O's in FIG. 5 (step 218 of FIG. 10).

The binary address generator 150 generates a subsequent address in binary sequence every cycle of the clock signal from the clock signal generator 164. If the stress time period of 168 hours has not yet expired (step 220 of FIG. 10), steps 214, 216, and 218 are repeated for the subsequent address generated by the address generator 150. If the stress time period of 168 hours has expired (step 220 of FIG. 10), the operation of the HTOL test system 200 of FIG. 9 ends.

Thereafter, the flash memory device 160 is removed from the burn-in board 174 and the heating chamber 176, and the flash memory device is itself further tested at room temperature. For example, before the stress time period of 168 hours, the array of flash memory cells 152 may have been programmed and erased in a checker-board pattern. After such a stress time period of 168 hours, the flash memory device 160 is tested to determine whether the array of flash memory cells 152 still retains the checker-board pattern of being programmed and erased.

Applicants conducted experiments of performing such HTOL tests within the HTOL test systems 190 of FIG. 7 and 200 of FIG. 9 with the results listed in the table of FIG. 12. A first column 312 of FIG. 12 describes the experimental conditions for the HTOL testing. A second column 314 describes the row location where a flash memory cell fails the HTOL testing. A third column 316 lists the number of flash memory device units that exhibits failure for the HTOL testing.

For a first experiment 322 of FIG. 12, the HTOL system 190 of FIG. 7 is used with the binary address generator 150 cycling through each address of the flash memory device by incrementing one-bit for each address in an ascending order (i.e., from all "0's" to all "1's"). In that case, each of the 90 flash memory devices is placed onto the burn-in board 174 and is subject to HTOL stressing for the stress time period of 168 hours. After such HTOL stressing, one flash memory device exhibits failure. Such failure is due to charge gain failure at a flash memory cell that has a programmed state instead of an expected erased state within the first row R0 of the first sector S0.

For a second experiment 324 of FIG. 12, the HTOL system 190 of FIG. 7 is used with the binary address generator 150 cycling through each address of the flash memory device by decrementing one-bit for each address in a descending order (i.e., from all "1's" to all "0's"). In that case, each of the 90 flash memory devices is placed onto the burn-in board 174 and is subject to HTOL stressing for the stress time period of 168 hours. After such HTOL stressing, two flash memory devices exhibit failure. Such failure for each of the two failed flash memory devices is due to charge gain failure at a flash memory cell that has a programmed state instead of an expected erased state within the last row R511 of the last sector S31.

For a third experiment 326 of FIG. 12, the HTOL system 190 of FIG. 7 is used with the binary address generator 150 cycling through each address of the flash memory device by decrementing one-bit for each address in a descending order (i.e., from all "1's" to all "0's") with a particular one of the row address bits A[15] being grounded as illustrated in FIG. 13. The four hundred and ninety sixth row R495 is represented by the particular row address bit A[15] being grounded to be a "0" bit with the rest of the row address bits A[14:7] being "1". In this situation, after the HTOL stressing of 90 flash memory devices in FIG. 7, four flash memory devices exhibit failure. Such failure for each of the four failed flash memory devices is due to charge gain failure at a flash memory cell that has a programmed state instead of an expected erased state within the four hundred and ninety sixth row R495 of the last sector S31.

For a fourth experiment 328 of FIG. 12, the HTOL system 190 of FIG. 7 is used with the binary address generator 150 cycling through each address of the flash memory device by decrementing one-bit for each address in a descending order (i.e., from all "1's" to all "0's") with another one of the row address bits A[14] being grounded as illustrated in FIG. 14. The five hundred and fourth row R503 is represented by the row address bit A[14] being grounded to be a "0" bit with the rest of the row address bits A[15] and A[13:7] being "1". In this situation, after the HTOL stressing of 90 flash memory devices in FIG. 7, two flash memory devices exhibit failure. Such failure for each of the two failed flash memory devices is due to charge gain failure at a flash memory cell that has a programmed state instead of an expected erased state within the five hundred and fourth row R503 of the last sector S31.

Finally for a fifth experiment 330 of FIG. 12, the HTOL test system 200 of FIG. 9 is used with the binary to gray code converter 204 generating the bit pattern for the address bits A'[20:0] in gray code sequence. In that case, each of 90 flash memory devices is placed onto the burn-in board 174 and is subject to HTOL stressing for the stress time period of 168 hours according to the flowchart of FIG. 10. After such HTOL stressing within the HTOL test system 200 of FIG. 9 and according to the flowchart of FIG. 10, none of the 90 flash memory devices exhibit charge gain failure.

After testing many units of the flash memory device, charge gain failure tended to occur most frequently at the last four sectors. For an explanation of charge gain failure in the third experiment 326 of FIG. 12, the probability of such charge gain failure for any flash memory cell in the array 152 is calculated as follows:

Total time of HTOL stress time period=168 hours $=168 \times 3600 \times 10^6$ μs (micro-seconds)$=6.048 \times 10^{11}$ μs Number of addresses accessed=(Total HTOL time)/
(Speed of clock signal generated from clock
signal generator 164 which is 1 μs for a 1
Mega-Hertz clock signal)$=6.048 \times 10^{11}$ Access frequency of the last electrical row at last
four sectors=(4/32 sectors)*(1/512 rows)*(Number of addresses accessed)=147,656,250

In the third experiment 326 of FIG. 12, 4/90 flash memory devices failed with one flash memory cell failing out of 1,024 columns for a row. Thus, the probability T of charge gain failure for any flash memory cell in the array 152 is calculated as follows:

$T=(4/90 \text{ units tested})*(1/1,024 \text{ columns})/(\text{Total access frequency})=2.94 \times 10^{-13}$.

Such a probability $T=2.94 \times 10^{-13}$ is too small for charge gain failure from hot electron injection where the probability is expected to be greater than 0.04. Rather the probability $T=2.94 \times 10^{-13}$ is more consistent with electron tunneling. Electron tunneling probability through a barrier is expressed as follows:

$T=\exp-[2me(V_b-V_{ds})d^2/h^2]^{1/2}$ m=electron mass=$9.1 \times 10^{-31}$ kg; e=electron charge=$1.6 \times 10^{-19}$ C; h=Planck's constant=$1.054 \times 10^{-34}$ Js; d=tunnel gate oxide thickness=$1.02 \times 10^{-8}$ meters; and $V_b$=barrier potential (assumed to be programming voltage)=8.5 Volts. $V_{ds}$=actual word line voltage. Since $T=2.94 \times 10^{-13}$, $(V_b-V_{ds})$=0.305 Volts. Thus, $V_{ds}$=8.195 Volts.

The nominal word line voltage during HTOL stressing is 6.5 Volts. Thus, a word line voltage overshoot of 1.695 Volts is causing the charge gain failure by electron tunneling into the floating gate of the failed memory cell. Such over-shoot is caused by a large number of bit transitions in the bit pattern of the address bits A[20:0] when just the binary address generator 150 is used in the HTOL test system 190 of FIG. 7. In the HTOL test system 190 of FIG. 7, the address bits A[20:0] are applied to the burn-in board 174. After the address for a "last row" is generated, a large number of bit transitions occur in going to the subsequent row. Such a large number of bit transitions for the address bits A[20:0] from the binary address generator 150 causes the word line voltage to overshoot resulting in charge gain failure at the subsequent row.

For example, for the first experiment 322 of FIG. 12, the binary address generator 150 of FIG. 7 cycles through each address of the flash memory device by incrementing one-bit for each address in an ascending order for the address bits A[20:0] (i.e., from all "0's" to all "1's"). The last row in that case is the last row R511 of the last sector S31 as indicated by the address bits A[20:0] that are all "1's". Also in that case, the subsequent row is the first row R0 of the first sector S0, and all twenty-one bits A[20:0] transition from all "1's" to all "0's" for that subsequent row at the binary address generator 150. When such a large number of bit transitions are applied to the leads of the burn-in board 174, a word line voltage overshoot occurs to cause a charge gain failure for one of the flash memory cells at the first row R0 of the first sector S0.

Similarly, for the second experiment 324 of FIG. 12, the binary address generator 150 of FIG. 7 cycles through each address of the flash memory device by decrementing one-bit for each address in a descending order for the address bits A[20:0] (i.e., from all "1's" to all "0's"). The last row in that case is the first row R0 of the first sector S0 as indicated by the address bits A[20:0] that are all "0's". Also in that case, the subsequent row is the last row R511 of the last sector S31, and all twenty-one bits A[20:0] transition from all "0's" to all "1's" for that subsequent row at the binary address generator 150. When such a large number of bit transitions are applied to the leads of the burn-in board 174, a word line voltage overshoot occurs to cause a charge gain failure for one of the flash memory cells at the last row R511 of the last sector S31.

In addition, for the third experiment 326 of FIG. 12, the binary address generator 150 of FIG. 7 cycles through each address of the flash memory device by decrementing one-bit for each address in a descending order for the address bits A[20:16] and A[14:0] with one address bit A[15] being grounded to "0". The last row in that case is the first row R0 of the first sector S0 as indicated by the address bits A[20:0] that are all "0's". Also in that case, the subsequent row is the four hundred and ninety-sixth row R495 of the last sector S31, and twenty bits A[20:16] and A[14:0] transition from "0's" to "1's" for that subsequent row at the binary address generator 150. When such a large number of bit transitions are applied to the leads of the burn-in board 174, a word line voltage overshoot occurs to cause a charge gain failure for one of the flash memory cells at the four hundred and ninety-sixth row R495 of the last sector S31.

Similarly, for the fourth experiment 328 of FIG. 12, the binary address generator 150 of FIG. 7 cycles through each address of the flash memory device by decrementing one-bit for each address in a descending order for the address bits A[20:15] and A[13:0] with one address bit A[14] being grounded to "0". The last row in that case is the first row R0 of the first sector S0 as indicated by the address bits A[20:0] that are all "0's". Also in that case, the subsequent row is the five hundred and fourth row R503 of the last sector S31, and twenty bits A[20:15] and A[13:0] transition from "0's" to "1's" for that subsequent row at the binary address generator 150. When such a large number of bit transitions are applied to the leads of the burn-in board 174, a word line voltage overshoot occurs to cause a charge gain failure for one of the flash memory cells at the five hundred and fourth row R503 of the last sector S31.

The first, second, third, and fourth experiments 322, 324, 326, and 328 are conduced with just the binary address generator in the HTOL test system 190 of FIG. 7. In contrast, the fifth experiment 330 of FIG. 12 is conducted using the binary to gray code converter 204 in the HTOL test system 200 of FIG. 9 according to the steps of the flowchart of FIG. 10. In that case, no charge gain failure occurs because a bit transition occurs for only one bit in incrementing or decrementing to a subsequent address in the bit pattern for the address bits A'[20:0] in gray code sequence. Such address bits A'[20:0] in gray code sequence are applied to the burn-in board 174 in FIG. 9. Thus, because of such a small number of bit transitions for going to a subsequent address in cycling through each address of the flash memory device 160, no charge gain failure occurs with the HTOL test system 200 of FIG. 9.

The foregoing is by way of example only and is not intended to be limiting. For example, the present invention is described for eliminating charge gain failure during HTOL testing. However, the present invention may also be advantageously applied for eliminating charge gain failure during cycling through the addresses of a flash memory device for any other applications or scenarios other than for the example of HTOL testing. In addition, the materials described herein are by way of example only. Furthermore, any numbers specified herein are by way of example only.

The present invention is limited only as defined in the following claims and equivalents thereof.

We claim:

1. A method of testing a memory device for determining operating life with stressing, comprising:
    cycling through each address of the memory device by generating a respective bit pattern comprised of a predetermined number of bits including row and column address bits for each address;
    applying stressing signals on a respective at least one cell of the memory device corresponding to each generated address in the cycling;
    wherein each of all possible row and column addresses of all of the row and column address bits is cycled through for application of the stressing signals;
    performing the cycling and the applying of the stressing signals for a predetermined stress time period; and
    minimizing charge gain failure in the memory device after the predetermined stress time period with a transition of less than the predetermined number of bits for sequencing to each subsequent address during the cycling through each of all possible row and column addresses of all of the row and column address bits.

2. The method of claim 1, further comprising:
    cycling through the respective bit pattern for each of the addresses in a gray code sequence.

3. The method of claim 2, wherein the memory device is a flash memory device.

4. The method of claim 3, wherein the stressing signals include a clock signal applied on a respective word line corresponding to each generated address, and include a bit line voltage applied on a respective at least one bit line corresponding to each generated address.

5. The method of claim 2, further comprising:
    generating a respective binary bit pattern for each of the addresses;
    converting the respective binary bit pattern to a respective gray code bit pattern for each of the addresses; and
    using the respective gray code bit pattern for the cycling.

6. The method of claim 2, further comprising:
    heating the memory device during the predetermined stress time period for HTOL (high temperature operating life) testing of the memory device.

7. The method of claim 1, further comprising:
    cycling through the respective bit pattern for each of the addresses with a transition of a fixed number of bits for sequencing to each subsequent address.

8. The method of claim 1, wherein the memory device is a flash memory device.

9. The method of claim 8, wherein the stressing signals include a clock signal applied on a respective word line corresponding to each generated address, and include a bit line voltage applied on a respective at least one bit line corresponding to each generated address.

10. The method of claim 1, further comprising:
    heating the memory device during the predetermined stress time period for HTOL (high temperature operating life) testing of the memory device.

11. A system for testing a memory device for determining operating life with stressing, comprising:
    an address generator for cycling through each address by generating a respective bit pattern comprised of a predetermined number of bits including row and column address bits for each address;
    signal generators for generating stressing signals applied on a respective at least one cell of the memory device corresponding to each generated address in the cycling;
    wherein each of all possible row and column addresses of all of the row and column address bits is cycled through for application of the stressing signals;
    and wherein the cycling and the applying of the stressing signals are performed for a predetermined stress time period; and
    means for minimizing charge gain failure in the memory device after the predetermined stress time period with a transition of less than the predetermined number of bits for sequencing to each subsequent address during the cycling through each of all possible row and column addresses of all of the row and column address bits.

12. The system of claim 11, further comprising:
   a gray code converter for cycling through the respective bit pattern for each of the addresses in a gray code sequence.

13. The system of claim 12, wherein the memory device is a flash memory device.

14. The system of claim 13, wherein the signal generators include:
   a clock signal generator for generating a clock signal applied on a respective word line corresponding to each generated address; and
   a bit line voltage generator for generating a bit line voltage applied on a respective at least one bit line corresponding to each generated address.

15. The system of claim 12, wherein the address generator generates a respective binary bit pattern for each of the addresses, and wherein the gray code converter converts the respective binary bit pattern to a respective gray code bit pattern for each of the addresses, and wherein the system further comprises:
   address decoders for decoding the respective gray code bit pattern for determining the respective at least one memory cell to have the stressing signals applied thereon.

16. The system of claim 12, further comprising:
   a heater for heating the memory device during the predetermined stress time period for HTOL (high temperature operating life) testing of the memory device.

17. The system of claim 11, further comprising:
   means for cycling through the respective bit pattern for each of the addresses with a transition of a fixed number of bits for sequencing to each subsequent address.

18. The system of claim 11, wherein the memory device is a flash memory device.

19. The system of claim 18, wherein the signal generators include:
   a clock signal generator for generating a clock signal applied on a respective word line corresponding to each generated address; and
   a bit line voltage generator for generating a bit line voltage applied on a respective at least one bit line corresponding to each generated address.

20. The system of claim 11, further comprising:
   a heater for heating the memory device during the predetermined stress time period for HTOL (high temperature operating life) testing of the memory device.

* * * * *

UNITED STATES PATENT AND TRADEMARK OFFICE
CERTIFICATE OF CORRECTION

PATENT NO. : 7,254,692 B1  
APPLICATION NO. : 10/791417  
DATED : August 7, 2007  
INVENTOR(S) : Wan Yen Teoh et al.

Page 1 of 1

It is certified that error appears in the above-identified patent and that said Letters Patent is hereby corrected as shown below:

Title Page: Item 73

The Assignee of "Advanced Micro Devices, Inc., Sunnyvale CA (US)" should be changed to:

--Spansion LLC, Sunnyvale, CA (US)--

Signed and Sealed this  
Fourth Day of March, 2014

Michelle K. Lee  
*Deputy Director of the United States Patent and Trademark Office*